(12) United States Patent
Choe et al.

(10) Patent No.: US 6,703,867 B1
(45) Date of Patent: Mar. 9, 2004

(54) CLOCKED FULL-RAIL DIFFERENTIAL LOGIC WITH SENSE AMPLIFIER AND SHUT-OFF

(75) Inventors: Swee Yew Choe, Milpitas, CA (US); Edgardo F. Klass, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/227,053

(22) Filed: Aug. 23, 2002

(51) Int. Cl.[7] .............................................. H03K 19/094
(52) U.S. Cl. ......................... 326/95; 326/98; 326/121; 326/96; 327/56; 327/57; 365/205; 365/207
(58) Field of Search .............................. 326/93–98, 121; 327/51–57; 365/205, 207

(56) References Cited

U.S. PATENT DOCUMENTS

| | | | |
|---|---|---|---|
| 4,247,791 A | 1/1981 | Rovell | 307/238 |
| 5,859,548 A | 1/1999 | Kong | 326/113 |
| 6,016,065 A * | 1/2000 | Kong | 326/121 |
| 6,211,704 B1 | 4/2001 | Kong | 326/121 |
| 6,614,264 B2 * | 9/2003 | Choe et al. | 326/95 |
| 6,624,664 B2 * | 9/2003 | Choe et al. | 326/95 |
| 6,630,846 B2 * | 10/2003 | Choe | 326/95 |

OTHER PUBLICATIONS

Choe et al., "Dynamic Half Rail Differential Logic for Low Power", IEEE 1997, pp. 1936 to 1939.

Jung et al., "Modular Charge Recycling Pass Transistor Logic (MCRPL)", Electronics Letters, Mar. 2, 2000 vol. 36 No. 5, pp. 404 to 405.

Kong et al., "Charge Recycling Differential Logic for Low-Power Application", ISSC96 secession 18, IEEE 0–780331962/98, 1998, pp. 302 to 448.

Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.

Won et al., "Modified Half Rail Differential Logic for Reduced Internal Logic Swing", IEEE 0–7803–4555–3/98, 1998, pp. II–157 to II–160.

Kong et al., "Charge Recycling Differential Logic (CRDL) for Low–Power Application", IEEE Journal of Solid–State Circuits, vol. 31, No. 9, Sep. 1996, pp. 1267 to 1276.

* cited by examiner

Primary Examiner—Vibol Tan
(74) Attorney, Agent, or Firm—Gunnison, McKay & Hodgson, L.L.P.; Philip J. McKay

(57) ABSTRACT

Clocked full-rail differential logic circuits with sense amplifier and shut-off are activated by a delayed clock and include a sense amplifier circuit that is triggered by a second delayed clock and a shut-off device. The addition of the sense amplifier circuit, and second delayed clock signal allows the sense amplifier circuit to act as the driver and therefore there is no need for increasing the size of the differential logic network to provide a driver function. The addition of the shut-off device provides a full-rail differential logic circuit with shut-off that does not experience the large "dip" experienced by prior art full-rail differential logic circuits and is therefore more power efficient.

22 Claims, 4 Drawing Sheets

CLOCKED FULL-RAIL DIFFERENTIAL LOGIC WITH SENSE AMPLIFIER AND SHUT-OFF

FIELD OF THE INVENTION

The present invention relates generally to logic circuits and, more particularly, to full-rail differential logic circuits.

BACKGROUND OF THE INVENTION

One example of a prior art full-rail differential logic circuit is presented and discussed at page 112, and shown in FIG. 3(c), in "HIGH SPEED CMOS DESIGN STYLES" by Bernstein et al. of IBM Microelectronics; Kluwer Academic Publishers, 101 Philip Drive, Assinippi Park, Norwell, Mass., 02061; ISBN 0-7923-8220-X, hereinafter referred to as the Bernstein et al. reference, which is incorporated herein by reference, in its entirety, for all purposes.

FIG. 1 shows a prior art full-rail differential logic circuit 100 similar to that discussed in the Bernstein et al. reference. As seen in FIG. 1, prior art full-rail differential logic circuit 100 included six transistors: PFET 105, PFET 107, NFET 109, PFET 115, PFET 117 and NFET 121. Prior art full-rail differential logic circuit 100 also included: differential logic 123 with inputs 151 and 153; out terminal 111; and outBar terminal 113. Prior art full-rail differential logic circuit 100 was activated from a clock signal CLKA. As shown in FIG. 1, signal CLKA was supplied to: gate 116 of PFET 115; gate 118 of PFET 117; gate 129 of NFET 109; and gate 122 of NFET 121.

Prior art full-rail differential logic circuit 100 worked reasonably well under conditions of a light load, for instance under conditions where fan out is less than four. However, prior art full-rail differential logic circuit 100 was less useful under conditions of a heavy load, for instance, in cases where fan out exceeded four. The shortcomings of prior art full-rail differential logic circuit 100 arose primarily because under heavy load conditions logic network 123 had to be increased in size to act as a driver for the next stage in the cascade. This in turn meant that logic network 123 was large, slow and inefficient. The problem was further aggravated as additional prior art full-rail differential logic circuits 100 were cascaded together to form the chains commonly used in the industry. Consequently, the full potential of prior art full-rail differential logic circuits 100 was not realized and their use was narrowly limited to light load applications.

In addition during the evaluation phase, prior art full-rail differential logic circuit 100 drew excess power unnecessarily as the relevant inputs, 151 or 153, to logic network 123 were transitioning low to shut off the path of one of the complementary output terminals, out terminal 111 or outBar terminal 113, to ground. The high output terminal, out terminal 111 or outBar terminal 113, therefore experienced a "dip" during the transition when the inputs 151 or 153 switched from high to low and a short circuit current, or crossbar current, path was established from Vdd 102 to ground. This "dip" was undesirable and resulted in significant power being wasted.

In addition, the structure of prior art full-rail differential logic circuit 100 was particularly susceptible to noise. This problem was extremely undesirable, and damaging, since, as discussed above, typically, multiple prior art full-rail differential logic circuits 100 were cascaded in long chains (not shown) of prior art full-rail differential logic circuits 100. In these chain configurations, the susceptibility of prior art full-rail differential logic circuit 100 to noise meant that each successive stage of the chain contributed additional noise and was even more adversely affected by the noise than the previous stage. Consequently, a few stages into a chain of prior art full-rail differential logic circuits 100, noise became the dominant factor in the chain.

What is needed is a method and apparatus for creating full-rail differential logic circuits that are capable of efficient use under heavy loads and are therefore more flexible, more space efficient and more reliable than prior art full-rail differential logic circuits. In addition, a full-rail differential logic circuit is needed that does not experience the large "dip" experienced by prior art full-rail differential logic circuit 100 and is therefore more power efficient. Finally, it is desirable to have a full-rail differential logic circuit that is more resistant to noise than prior art full-rail differential logic circuit 100.

SUMMARY OF THE INVENTION

The clocked full-rail differential logic circuits with sense amplifier and shut-off of the invention include a sense amplifier circuit that is triggered by the delayed clock of the following stage, i.e., the clock input to the sense amplifier circuit of the clocked full-rail differential logic circuits with sense amplifier and shut-off of the invention is additionally delayed with respect to the delayed clock that drives the full-rail differential logic. The addition of the sense amplifier circuit, and second delayed clock signal, according to the invention, allows the sense amplifier circuit to act as the driver and therefore there is no need for increasing the size of the logic network to provide the driver function. Consequently, the clocked full-rail differential logic circuits with sense amplifier and shut-off of the invention are capable of operating efficiently under heavy load conditions without the increased size and the significant reduction in speed associated with prior art full-rail differential logic circuits.

In addition, according to the present invention, clocked full-rail differential logic circuits with sense amplifier and shut-off include shut-off devices to minimize the "dip" at the high output node that was associated with prior art clocked full-rail differential logic circuits. The shut-off device of the invention isolates the high output terminal immediately from the input terminals when the complementary output terminal is pulled to ground. Consequently, according to the present invention, the window period, or path, for the short circuit current, or crossbar current, is significantly decreased and power is saved.

In addition, since clocked full-rail differential logic circuits with sense amplifier and shut-off include a shut-off device, the high output terminal is isolated from the input terminals and the noise immunity of the clocked full-rail differential logic circuits with sense amplifier and shut-off of the invention is significantly better than prior art clocked full-rail differential logic circuits because noise on the input terminal does not affect the high output terminal after evaluation. Consequently, the clocked full-rail differential logic circuits with sense amplifier and shut-off of the invention are better suited for application in cascaded chains.

As discussed above, the clocked full-rail differential logic circuits with sense amplifier and shut-off of the invention can be cascaded together to form the chains commonly used in the industry. When the clocked full-rail differential logic circuits with sense amplifier and shut-off of the invention are cascaded together, the advantages of the clocked full-rail differential logic circuits with sense amplifier and shut-off of the invention are particularly evident and the gains in terms of noise immunity, power efficiency, size reduction and flexibility are further pronounced.

In particular, one embodiment of the invention is a cascaded chain of clocked full-rail differential logic circuits with sense amplifier and shut-off. The chain includes a first clocked full-rail differential logic circuit with sense amplifier and shut-off. The first clocked full-rail differential logic circuit with sense amplifier and shut-off includes: a first clocked full-rail differential logic circuit with sense amplifier and shut-off first clock input terminal; at least one first clocked full-rail differential logic circuit with sense amplifier and shut-off data input terminal; at least one first clocked full-rail differential logic circuit with sense amplifier and shut-off data output terminal; and a first clocked full-rail differential logic circuit with sense amplifier and shut-off second clock input terminal.

The cascaded chain of the invention also includes a second clocked full-rail differential logic circuit with sense amplifier and shut-off. The second clocked full-rail differential logic circuit with sense amplifier and shut-off includes: a second clocked full-rail differential logic circuit with sense amplifier and shut-off first clock input terminal; at least one second clocked full-rail differential logic circuit with sense amplifier and shut-off data input terminal; at least one second clocked full-rail differential logic circuit with sense amplifier and shut-off data output terminal; and a second clocked full-rail differential logic circuit with sense amplifier and shut-off second clock input terminal.

According to the invention, the at least one first clocked full-rail differential logic circuit with sense amplifier and shut-off data output terminal is coupled to the at least one second clocked full-rail differential logic circuit with sense amplifier and shut-off data input terminal to form the chain.

According to the invention, a first clock signal is coupled to the first clocked full-rail differential logic circuit with sense amplifier and shut-off first clock input terminal and a second clock signal is coupled to the first clocked full-rail differential logic circuit with sense amplifier and shut-off second clock input terminal and the second clocked full-rail differential logic circuit with sense amplifier and shut-off first clock input terminal. According to the invention, the second clock signal is delayed with respect to the first clock signal by a predetermined delay time.

In one embodiment of the invention, a delay circuit is coupled between the first clocked full-rail differential logic circuit with sense amplifier and shut-off first clock input terminal and the second clocked full-rail differential logic circuit with sense amplifier and shut-off first clock input terminal to provide the predetermined delay time. In one embodiment of the invention, the delay circuit is also coupled between the first clocked full-rail differential logic circuit with sense amplifier and shut-off first clock input terminal and the first clocked full-rail differential logic circuit with sense amplifier and shut-off second clock input terminal to provide the predetermined delay time.

One embodiment of the invention is a clocked full-rail differential logic circuit with sense amplifier and shut-off that includes a clocked full-rail differential logic circuit with sense amplifier and shut-off out terminal and a clocked full-rail differential logic circuit with sense amplifier and shut-off outBar terminal.

In one embodiment of the invention, the clocked full-rail differential logic circuit with sense amplifier and shut-off also includes a first node, the first node is coupled to a first supply voltage.

In one embodiment of the invention, the clocked full-rail differential logic circuit with sense amplifier and shut-off also includes a first transistor, the first transistor including a first transistor first flow electrode, a first transistor second flow electrode and a first transistor control electrode. The first node is coupled to the first transistor first flow electrode and the first transistor second flow electrode is coupled to the clocked full-rail differential logic circuit with sense amplifier and shut-off out terminal. The first transistor can also include a back bias input terminal having a back bias voltage thereon.

In one embodiment of the invention, the clocked full-rail differential logic circuit with sense amplifier and shut-off also includes a second transistor, the second transistor including a second transistor first flow electrode, a second transistor second flow electrode and a second transistor control electrode. The first node is coupled to the second transistor first flow electrode and the second transistor second flow electrode is coupled to the clocked full-rail differential logic circuit with sense amplifier and shut-off outBar terminal.

In one embodiment of the invention, the clocked full-rail differential logic circuit with sense amplifier and shut-off also includes a third transistor, the third transistor including a third transistor first flow electrode, a third transistor second flow electrode and a third transistor control electrode. The first transistor control electrode is coupled to the third transistor first flow electrode and the clocked full-rail differential logic circuit with sense amplifier and shut-off outBar terminal. The second transistor control electrode is coupled to the third transistor second flow electrode and the clocked full-rail differential logic circuit with sense amplifier and shut-off out terminal. The third transistor control electrode is coupled to a clock signal CLKA.

In one embodiment of the invention, the clocked full-rail differential logic circuit with sense amplifier and shut-off also includes a fourth transistor, the fourth transistor including a fourth transistor first flow electrode, a fourth transistor second flow electrode and a fourth transistor control electrode. The first node is coupled to the fourth transistor first flow electrode and the fourth transistor second flow electrode is coupled to the clocked full-rail differential logic circuit with sense amplifier and shut-off out terminal. The fourth transistor control electrode is coupled to the clock signal CLKA. The fourth transistor can also include a back bias input terminal having a back bias voltage thereon.

In one embodiment of the invention, the clocked full-rail differential logic circuit with sense amplifier and shut-off also includes a fifth transistor, the fifth transistor including a fifth transistor first flow electrode, a fifth transistor second flow electrode and a fifth transistor control electrode. The first node is coupled to the fifth transistor first flow electrode and the fifth transistor second flow electrode is coupled to the clocked full-rail differential logic circuit with sense amplifier and shut-off outbar terminal. The fifth transistor control electrode is coupled to the clock signal CLKA. The fifth transistor can also include a back bias input terminal having a back bias voltage thereon.

In one embodiment of the invention, the clocked full-rail differential logic circuit with sense amplifier and shut-off also includes a sense amplifier circuit coupled between the clocked full-rail differential logic circuit with sense amplifier and shut-off out terminal and the clocked full-rail differential logic circuit with sense amplifier and shut-off outBar terminal.

In one embodiment of the invention, the clocked full-rail differential logic circuit with sense amplifier and shut-off sense amplifier circuit includes a sixth transistor, the sixth transistor including a sixth transistor first flow electrode, a sixth transistor second flow electrode and a sixth transistor control electrode. The first transistor second flow electrode is coupled to the sixth transistor first flow electrode. The sixth transistor second flow electrode is coupled to a second node. The sixth transistor control electrode is coupled to the third transistor first flow electrode and the clocked full-rail differential logic circuit with sense amplifier and shut-off outbar terminal.

In one embodiment of the invention, the clocked full-rail differential logic circuit with sense amplifier and shut-off sense amplifier circuit also includes a seventh transistor, the seventh transistor including a seventh transistor first flow electrode, a seventh transistor second flow electrode and a seventh transistor control electrode. The second transistor second flow electrode is coupled to the seventh transistor first flow electrode. The seventh transistor second flow electrode is coupled to the second node. The seventh transistor control electrode is coupled to the third transistor second flow electrode and the clocked full-rail differential logic circuit with sense amplifier and shut-off out terminal.

In one embodiment of the invention, the clocked full-rail differential logic circuit with sense amplifier and shut-off sense amplifier circuit also includes an eighth transistor, the eighth transistor including an eighth transistor first flow electrode, an eighth transistor second flow electrode and an eighth transistor control electrode. The eighth transistor first flow electrode is coupled to the second node and the eighth transistor second flow electrode is coupled to a second supply voltage. A clock signal CLKB is coupled to the eighth transistor control electrode of the clocked full-rail differential logic circuit with sense amplifier and shut-off sense amplifier circuit. In one embodiment of the invention, the clock signal CLKB is delayed a predetermined time with respect to the clock signal CLKA.

In one embodiment of the invention, the clocked full-rail differential logic circuit with sense amplifier and shut-off also includes a shut-off device coupled between the clocked full-rail differential logic circuit with sense amplifier and shut-off out terminal and the clocked full-rail differential logic circuit with sense amplifier and shut-off outBar terminal and the logic network out terminal and logic network outBar terminal.

In one embodiment of the invention, the clocked full-rail differential logic circuit with sense amplifier and shut-off shut-off device includes a ninth transistor, the ninth transistor including a ninth transistor first flow electrode, a ninth transistor second flow electrode and a ninth transistor control electrode. The fourth transistor second flow electrode is coupled to the ninth transistor first flow electrode. The ninth transistor second flow electrode is coupled to the logic network out terminal. The ninth transistor control electrode is coupled to the third transistor first flow electrode and the clocked full-rail differential logic circuit with sense amplifier and shut-off outbar terminal.

In one embodiment of the invention, the clocked full-rail differential logic circuit with sense amplifier and shut-off shut-off device also includes a tenth transistor, the tenth transistor including a tenth transistor first flow electrode, a tenth transistor second flow electrode and a tenth transistor control electrode. The fifth transistor second flow electrode is coupled to the tenth transistor first flow electrode. The tenth transistor second flow electrode is coupled to the logic network outBar terminal. The tenth transistor control electrode is coupled to the third transistor second flow electrode and the clocked full-rail differential logic circuit with sense amplifier and shut-off out terminal.

In one embodiment of the invention, the clocked full-rail differential logic circuit with sense amplifier and shut-off also includes a logic network, the logic network including at least one logic network input terminal, a logic network out terminal and a logic network outBar terminal. The logic network out terminal is coupled to the second flow electrode of the ninth transistor and the logic network outBar terminal is coupled to the second flow electrode of the tenth transistor.

In one embodiment of the invention, the clocked full-rail differential logic circuit with sense amplifier and shut-off also includes a eleventh transistor, the eleventh transistor including a eleventh transistor first flow electrode, a eleventh transistor second flow electrode and a eleventh transistor control electrode. The eleventh transistor first flow electrode is coupled to the logic network. The eleventh transistor control electrode is coupled to the clock signal CLKA. The eleventh transistor second flow electrode is coupled to the second supply voltage.

As discussed in more detail below, the clocked full-rail differential logic circuits with sense amplifier and shut-off of the invention are capable of efficient use under heavy loads and are therefore more flexible, more space efficient and more reliable than prior art full-rail differential logic circuits. In addition, the present invention provides a full-rail differential logic circuit with shut-off that does not experience the large "dip" experienced by prior art full-rail differential logic circuits and is therefore more power efficient. In addition, the present invention provides a full-rail differential logic circuit with shut-off that is more resistant to noise than prior art full-rail differential logic circuits.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

Figure 1:
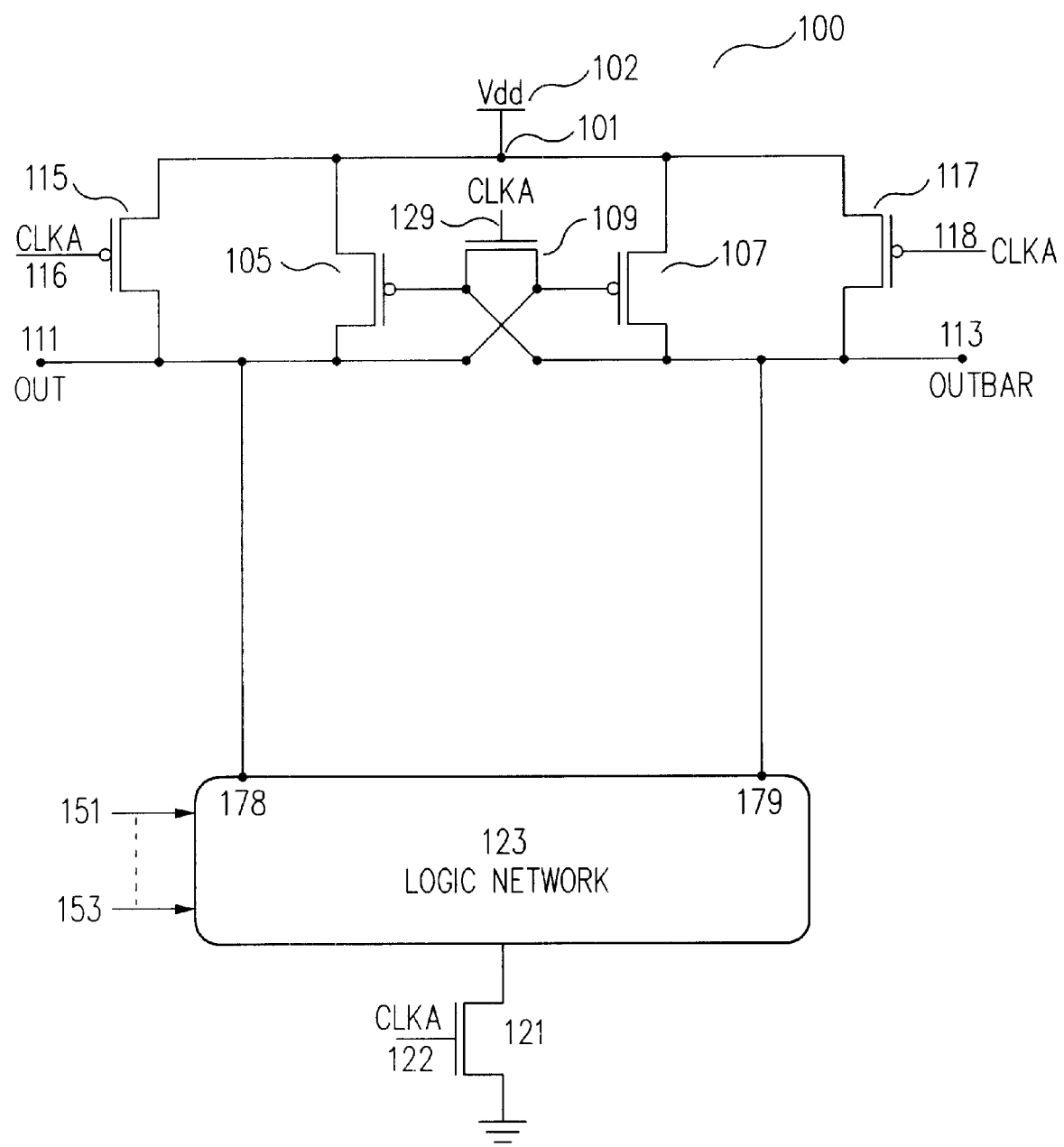
FIG. 1 shows a schematic diagram of a prior art full-rail differential logic circuit.

The invention will now be described in reference to the accompanying drawings. The same reference numbers may be used throughout the drawings and the following description to refer to the same or like parts.

The clocked full-rail differential logic circuits with sense amplifier and shut-off (200 in FIG. 2) of the invention include a sense amplifier circuit (280 in FIG. 2) that is triggered by the delayed clock of the following stage, i.e., the clock input (327A, 327B, 327C and 327N in FIG. 3) to the sense amplifier circuit of the clocked full-rail differential logic circuits with sense amplifier and shut-off of the invention is additionally delayed with respect to the delayed clock (361 371, 381 and 391 in FIG. 3) that drives the full-rail differential logic. The addition of the sense amplifier circuit, and second delayed clock signal, according to the invention, allows the sense amplifier circuit to act as the driver and therefore there is no need for increasing the size of the logic network (223 in FIG. 2) to provide the driver function. Consequently, the clocked full-rail differential logic circuits with sense amplifier and shut-off of the invention are capable of operating efficiently under heavy load conditions without the increased size and the significant reduction in speed associated with prior art full-rail differential logic circuits (100 in FIG. 1).

In addition, according to the present invention, clocked full-rail differential logic circuits with sense amplifier and shut-off include shut-off devices (290A and 290B) to minimize the "dip" at the high output node that was associated with prior art clocked full-rail differential logic circuits. The shut-off device of the invention isolates the high output terminal (211 or 213 in FIG. 2) immediately from the input terminals (251 and 253 in FIG. 3) when the complementary output terminal is pulled to ground. Consequently, according to the present invention, the window period, or path, for the short circuit current, or crossbar current, is significantly decreased and power is saved.

In addition, since clocked full-rail differential logic circuits with sense amplifier and shut-off include a shut-off device, the high output terminal is isolated from the input terminals and the noise immunity of the clocked full-rail differential logic circuits with sense amplifier and shut-off of the invention is significantly better than prior art clocked full-rail differential logic circuits because noise on the input terminal does not affect the high output terminal after evaluation. Consequently, the clocked full-rail differential logic circuits with sense amplifier and shut-off of the invention are better suited for application in cascaded chains (301 in FIG. 3).

As discussed above, the clocked full-rail differential logic circuits with sense amplifier and shut-off of the invention can be cascaded together to form the chains (301 in FIG. 3) commonly used in the industry. When the clocked full-rail differential logic circuits with sense amplifier and shut-off of the invention are cascaded together, the advantages of the clocked full-rail differential logic circuits with sense amplifier and shut-off of the invention are particularly evident and the gains in terms of noise immunity, power efficiency, size reduction and flexibility are further pronounced.

Figure 2:
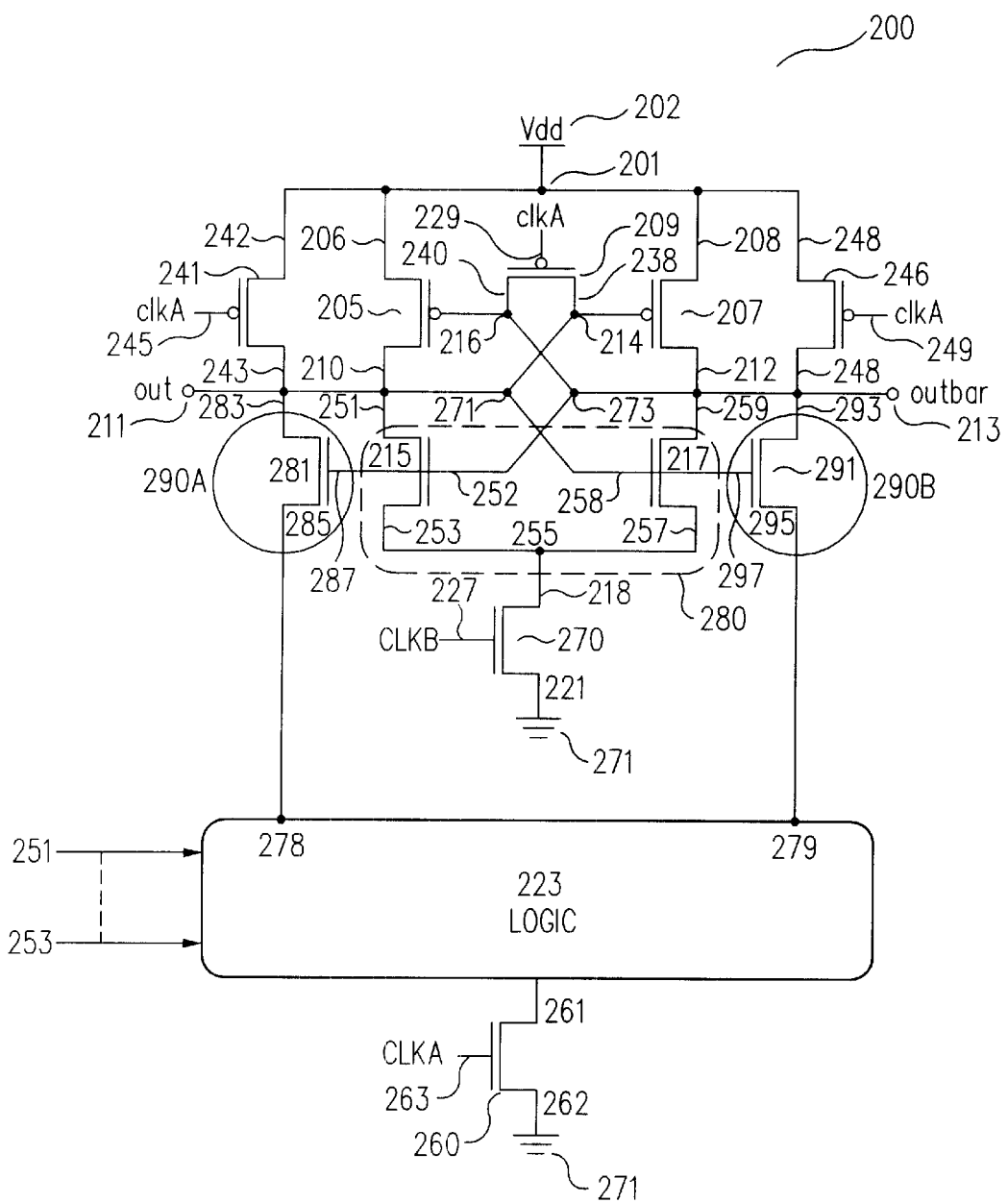
FIG. 2 shows a schematic diagram of one embodiment of a clocked full-rail differential logic circuit with sense amplifier and shut-off designed according to the principles of the present invention.

FIG. 2 shows a schematic diagram of one embodiment of a clocked full-rail differential logic circuit with sense amplifier and shut-off 200 designed according to the principles of the present invention. As seen in FIG. 2, clocked full-rail differential logic circuit with sense amplifier and shut-off 200 includes a first supply voltage 202 coupled to a first node 201. First node 201 is coupled to: a source 206 of a first transistor, PFET 205; a source 208 of a second transistor, PFET 207; a source 242 of a fourth transistor, PFET 241 and a source 247 of a fifth transistor, PFET 246. The clock signal CLKA is coupled to: a control electrode or gate 245 of PFET 241; a control electrode or gate 249 of PFET 246; a control electrode or gate 229 of a third transistor, PFET 209; a control electrode or gate 263 of an eleventh transistor, NFET 260.

A control electrode or gate 216 of PFET 205 is coupled to a source 240 of PFET 209 and an outBar terminal 213. A control electrode or gate 214 of PFET 207 is coupled to a drain 238 of PFET 209 and an out terminal 211. A drain 210 of PFET 205 is coupled to out terminal 211 and a drain 212 of PFET 207 is coupled to outBar terminal 213.

As discussed above, gate 245 of PFET 241 is coupled to clock signal CLKA, as is gate 249 of PFET 246. A drain 243 of PFET 241 is coupled to out terminal 211 and a drain 248 of PFET 249 is coupled to outBar terminal 213.

According to the invention, clocked full-rail differential logic circuit with sense amplifier and shut-off 200 also includes sense amplifier circuit 280. In one embodiment of the invention, sense amplifier circuit 280 includes a sixth transistor, NFET 215 including a drain 251, a source 253 and a control electrode or gate 252. Drain 210 of PFET 205 is coupled to drain 251 of NFET 215. Source 253 of NFET 215 is coupled to a second node 255. Gate 252 of NFET 215 is coupled to source 240 of PFET 209 and clocked full-rail differential logic circuit with sense amplifier and shut-off outBar terminal 213.

In one embodiment of the invention, sense amplifier circuit 280 also includes a seventh transistor, NFET 217 including a drain 259, a source 257 and a control electrode or gate 258. Drain 212 of PFET 207 is coupled to drain 259 of NFET 217. Source 257 of NFET 217 is coupled to a second node 255. Gate 258 of NFET 217 is coupled to drain 238 of PFET 209 and clocked full-rail differential logic circuit with sense amplifier and shut-off out terminal 211.

In one embodiment of the invention, sense amplifier circuit 280 of clocked full-rail differential logic circuit with sense amplifier and shut-off 200 also includes an eighth transistor, NFET 270, including a drain 218, a source 221 and a control electrode or gate 227. Drain 218 of NFET 270 is coupled to second node 255. Source 221 of NFET 270 is coupled to a second supply voltage 271. A delayed clock signal CLKB is coupled to control electrode or gate 227 of NFET 270. According to one embodiment of the invention, clock signal CLKB is delayed with respect to clock signal CLKA by a predetermined time.

In one embodiment of the invention, the clocked full-rail differential logic circuit with sense amplifier and shut-off also includes a logic network 223. In one embodiment of the invention, logic network 223 is an NMOS pass transistor logic network including input terminals 251 and 253. Logic network 223 includes a logic network out terminal 278 and a logic network outBar terminal 279. In other embodiments of the invention, logic network 223 includes any type of differential logic and/or circuitry used in the art including various logic gates, logic devices and circuits.

According to the invention, clocked full-rail differential logic circuit with sense amplifier and shut-off 200 also includes shut-off device 290A/290B. In one embodiment of the invention, shut-off device 290A/290B includes a ninth transistor, NFET 281 including a drain 283, a source 285 and a control electrode or gate 287. Drain 210 of PFET 205 is coupled to drain 283 of NFET 281. Source 285 of NFET 281 is coupled to out terminal 278 of logic network 223. Gate 287 of NFET 281 is coupled to source 240 of PFET 209 and clocked full-rail differential logic circuit with sense amplifier and shut-off outBar terminal 213.

In one embodiment of the invention, shut-off device 290A/290B also includes a tenth transistor, NFET 291 including a drain 293, a source 295 and a control electrode or gate 297. Drain 212 of PFET 207 is coupled to drain 293 of NFET 291. Source 295 of NFET 291 is coupled to outBar terminal 279 of logic network 223. Gate 297 of NFET 291 is coupled to drain 238 of PFET 209 and clocked full-rail differential logic circuit with sense amplifier and shut-off out terminal 211.

A particular embodiment of a clocked full-rail differential logic circuit with sense amplifier and shut-off 200 according to the invention is shown in FIG. 2. Those of skill in the art will recognize that clocked full-rail differential logic circuit with sense amplifier and shut-off 200 can be easily modified. For example, different transistors, i.e., PFETs 205, 207, 209, 241, and 246 or NFETs 215, 217, 260, 270, 281 and 291 can be used. In particular, the NFETs and PFETS shown in FIG. 2 can be readily exchanged for PFETs and NFETs by reversing the polarities of the supply voltages 202 and 271, or by other well known circuit modifications. Consequently, the clocked full-rail differential logic circuit with sense amplifier and shut-off 200 that is shown in FIG. 2 is simply one embodiment of the invention used for illustrative purposes only and does not limit the present invention to that one embodiment of the invention.

As discussed above, clocked full-rail differential logic circuit with sense amplifier and shut-off 200 of the invention includes sense amplifier circuit 280 that is triggered by delayed clock signal CLKB of the following stage, i.e., the clock signal CLKB to gate 227 of NFET 270 of sense amplifier circuit 280 is additionally delayed with respect to the delayed clock signal CLKA. Clock signal CLKA is coupled to: gate 245 of PFET 241; gate 229 of PFET 209; gate 249 of PFET 246 and gate 263 of NFET 260. The addition of sense amplifier circuit 280 and second delayed clock signal CLKB, according to the invention, allows sense amplifier circuit 280 to act as the driver and therefore there is no need for increasing the size of the logic network 223 to provide the driver function. Consequently, clocked full-rail differential logic circuit with sense amplifier and shut-off 200 of the invention is capable of operating efficiently under heavy load conditions without the significant reduction in speed associated with prior art full-rail differential logic circuits 100. In addition, clocked full-rail differential logic circuit with sense amplifier and shut-off 200 requires less space, is simpler, dissipates less heat and has fewer components to potentially fail.

The addition of shut-off device 290A/290B, according to the present invention, allows clocked full-rail differential logic circuit with sense amplifier and shut-off 200 to minimize the "dip" at the high output terminal 211 or 213 that was associated with prior art clocked full-rail differential logic circuits (100 in FIG. 1). In operation, during the pre-charge phase, i.e., when signal CLKA is low, PFETs 241 and 246 charge the respective low output of either clocked full-rail differential logic circuit with sense amplifier and shut-off out terminal 211 or clocked full-rail differential logic circuit with sense amplifier and shut-off outBar terminal 213 to supply voltage 201, typically Vdd. During precharge, PFETs 205 and 207 are off and shut-off device NFETs 281 and 291 are on, or conduct.

During evaluation, i.e., when signal CLKA is high, NFET 260 conducts and PFETs 241, 209, and 246 are off. In this phase, one of clocked full-rail differential logic circuit with sense amplifier and shut-off out terminal 211 or clocked full-rail differential logic circuit with sense amplifier and shut-off outBar terminal 213 is discharged through logic network 223 and the other one of clocked full-rail differential logic circuit with sense amplifier and shut-off outBar terminal 213 or clocked full-rail differential logic circuit with sense amplifier and shut-off out terminal 211 is pulled up to first supply voltage 201, typically Vdd, after experiencing a slight dip caused by the input terminals 251 and/or 253 continuing to transition low. Whichever one of the shut-off device NFETs 281 and 291 is controlled by the low terminal, i.e., either clocked full-rail differential logic circuit with sense amplifier and shut-off out terminal 211 or clocked full-rail differential logic circuit with sense amplifier and shut-off outBar terminal 213, will then turn off and isolate the complementary high terminal, i.e., clocked full-rail differential logic circuit with sense amplifier and shut-off outBar terminal 213 or clocked full-rail differential logic circuit with sense amplifier and shut-off out terminal 211. Whichever one of either clocked full-rail differential logic circuit with sense amplifier and shut-off out terminal 211 or clocked full-rail differential logic circuit with sense amplifier and shut-off outBar terminal 213 is low, that low terminal will also cause one of either PFET 205 or 207 to turn on or conduct. Consequently, the cross-coupled connection of PFETs 205 and 207 provides a latch-like function to maintain the voltage level after evaluation.

In short, shut-off device 290A/290B of the invention isolates the high output terminal (211 or 213) immediately from the input terminals (251 and 253) when the complementary output terminal (213 or 211) is pulled to ground. Consequently, according to the present invention, the window period, or path, for the short circuit current, or crossbar current, is significantly decreased and power is saved.

In addition, since clocked full-rail differential logic circuits with sense amplifier and shut-off 200 include shut-off device 290A/290B, the high output terminal (211 or 213) is isolated from input terminals (251 and 253) and the noise immunity of clocked full-rail differential logic circuits with sense amplifier and shut-off 200 of the invention is significantly better than prior art clocked full-rail differential logic circuits because noise on input terminals (251 and 253) does not affect the high output terminal (211 or 213) after evaluation. Consequently, clocked full-rail differential logic circuits with sense amplifier and shut-off 200 of the invention are better suited for application in cascaded chains.

As also discussed above, clocked full-rail differential logic circuit with sense amplifier and shut-off 200 can be cascaded together with other clocked full-rail differential logic circuits with sense amplifier and shut-off 200 to form the chains commonly used in the industry. When clocked full-rail differential logic circuits with sense amplifier and shut-off 200 of the invention are cascaded together, the advantages of clocked full-rail differential logic circuit with sense amplifier and shut-off 200 is particularly evident and the gains in terms of efficiency, size reduction and flexibility are further pronounced.

When clocked full-rail differential logic circuits with sense amplifier and shut-off 200 of the invention are cascaded together, the delayed clock signal CLKA is, according to the invention, timed to be at least the delay of the previous clocked full-rail differential logic circuit with sense amplifier and shut-off 200 (not shown) to ensure each clocked full-rail differential logic circuit with sense amplifier and shut-off 200 of the invention is switched or "fired" only after it has received an input from the previous clocked full-rail differential logic circuit with sense amplifier and shut-off 200.

Figure 3:
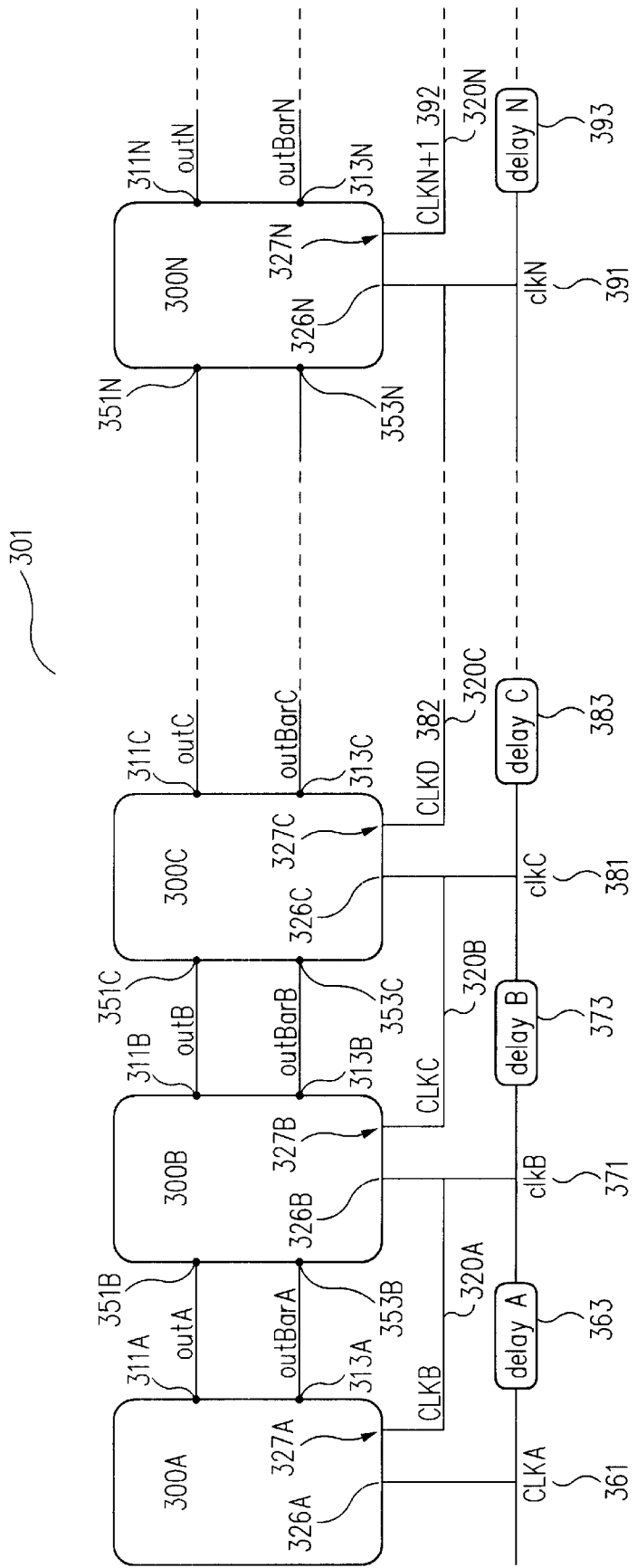
FIG. 3 shows one embodiment of a cascaded chain of clocked full-rail differential logic circuits with sense amplifier and shut-off according to the principles of the present invention.

FIG. 3 shows one embodiment of a cascaded chain 301 of clocked full-rail differential logic circuits with sense amplifier and shut-off 300A, 300B, 300C and 300N of the present invention. Each clocked full-rail differential logic circuit with sense amplifier and shut-off 300A, 300B, 300C and 300N represents a stage in cascaded chain 301. In one embodiment of the invention, each clocked full-rail differential logic circuit with sense amplifier and shut-off 300A, 300B, 300C and 300N is similar to clocked full-rail differential logic circuit with sense amplifier and shut-off 200 discussed above with respect to FIG. 2.

As seen in FIG. 3, clocked full-rail differential logic circuit with sense amplifier and shut-off 300A includes: a first clock input terminal 326A; a second clock input terminal 327A; an out terminal 311A; and an outbar terminal 313A.

Clocked full-rail differential logic circuit with sense amplifier and shut-off 300B includes: a first clock input terminal 326B; a second clock input terminal 327B; an input terminal 351B, coupled to out terminal 311A of clocked full-rail differential logic circuit with sense amplifier and shut-off 300A; an inputBar terminal 353B, coupled to outBar terminal 313A of clocked full-rail differential logic circuit with sense amplifier and shut-off 300A; an output terminal 311B; and an outBar terminal 313B. Likewise, clocked full-rail differential logic circuit with sense amplifier and shut-off 300C includes: a first clock input terminal 326C; a second clock input terminal 327C; an input terminal 351C, coupled to output terminal 311B of clocked full-rail differential logic circuit with sense amplifier and shut-off 300B; an inputBar terminal 353C, coupled to outBar terminal 313B of clocked full-rail differential logic circuit with sense amplifier and shut-off 300B; an output terminal 311C; and an outBar terminal 313C.

Clocked full-rail differential logic circuit with sense amplifier and shut-off 300N includes: a first clock input terminal 326N; a second clock input terminal 327N; an input terminal 351N, coupled to an output terminal 311N−1 (not shown) of a clocked full-rail differential logic circuit with sense amplifier and shut-off 300N−1 (not shown); an inputBar terminal 353N, coupled to an outBar terminal 313N−1 (not shown) of a clocked full-rail differential logic circuit with sense amplifier and shut-off 300−1 (not shown); an output terminal 311N; and an outBar terminal 313N.

According to the invention, any number of clocked full-rail differential logic circuits with sense amplifier and shut-off 300A, 300B, 300C and 300N can be employed with cascaded chain 301. As also shown in FIG. 3, and discussed above, output terminal 311A of clocked full-rail differential logic circuit with sense amplifier and shut-off 300A couples signal OUTA to input terminal 351B of clocked full-rail differential logic circuit with sense amplifier and shut-off 300B and outBar terminal 313A of clocked full-rail differential logic circuit with sense amplifier and shut-off 300A couples signal OUTBARA to inputBar terminal 353B of clocked full-rail differential logic circuit with sense amplifier and shut-off 300B. Likewise, output terminal 311B of clocked full-rail differential logic circuit with sense amplifier and shut-off 300B couples signal OUTB to input terminal 351C of clocked full-rail differential logic circuit with sense amplifier and shut-off 300C and outBar terminal 313B of clocked full-rail differential logic circuit with sense amplifier and shut-off 300B couples signal OUTBARB to inputBar terminal 353C of clocked full-rail differential logic circuit with sense amplifier and shut-off 300C. In addition, output terminal 311N of clocked full-rail differential logic circuit with sense amplifier and shut-off 300N couples signal OUTN to an input terminal 351N+1 (not shown) of a clocked full-rail differential logic circuit with sense amplifier and shut-off 300N+1 (not shown) and outBar terminal 313N of clocked full-rail differential logic circuit with sense amplifier and shut-off 300N couples signal OUTBARN to an inputBar terminal 353N+1 (not shown) of a clocked full-rail differential logic circuit with sense amplifier and shut-off 300N+1 (not shown).

According to the invention, each clocked full-rail differential logic circuit with sense amplifier and shut-off 300A, 300B, 300C and 300N of cascaded chain 301 receives its own delayed first clock signal CLKA 361, CLKB 371, CLKC 381 and CLKN 391, respectively. According to the invention clock signals CLKA 361, CLKB 371, CLKC 381 and CLKN 391 are provided to clocked full-rail differential logic circuits with sense amplifier and shut-off 300A, 300B, 300C and 300N, respectively, by introducing delay circuits 363, 373, 383 and 393 between successive clocked full-rail differential logic circuits with sense amplifier and shut-off 300A, 300B, 300C and 300N. Consequently, delay circuit 363 introduces a delay time between signal CLKA 361, coupled to first clock input terminal 326A of clocked full-rail differential logic circuit with sense amplifier and shut-off 300A, and signal CLKB 371, coupled to first clock input terminal 326B of clocked full-rail differential logic circuit with sense amplifier and shut-off 300B. Delay circuit 373 introduces a delay time between signal CLKB 371 and signal CLKC 381, coupled to first clock input terminal 326C of clocked full-rail differential logic circuit with sense amplifier and shut-off 300C. Two delay circuits 363 and 373 introduce two delay times between signal CLKA 361 and signal CLKC 381. Likewise, a series of N−1 delay circuits, and N−1 delay times, exists between signal CLKA 361 and signal CLKN 391, coupled to first clock input terminal 326N of clocked full-rail differential logic circuit with sense amplifier and shut-off 300N, and a further delay circuit 393 introduces a further delay time between CLKN 391 and CLK N+1 (not shown) coupled to a first clock input terminal 326N+1 (not shown) of a clocked full-rail differential logic circuit with sense amplifier and shut-off 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each clocked full-rail differential logic circuit with sense amplifier and shut-off 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to clocked full-rail differential logic circuit with sense amplifier and shut-off 300A, 300B, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system.

In addition, according to the invention, each clocked full-rail differential logic circuit with sense amplifier and shut-off 300A, 300B, 300C and 300N of cascaded chain 301 receives a second delayed clock signal at its second clock input terminal 327A, 327B, 327C and 327N, respectively. In one embodiment of the invention, the second delayed clock signal for a given clocked full-rail differential logic circuit with sense amplifier and shut-off 300A, 300B, 300C and 300N of cascaded chain 301 is the delayed clock signal of the following clocked full-rail differential logic circuit with sense amplifier and shut-off 300A, 300B, 300C and 300N in cascaded chain 301. In this embodiment of the invention, the second delayed clock signal for a given clocked full-rail differential logic circuit with sense amplifier and shut-off 300A, 300B, 300C and 300N of cascaded chain 301 is provided by coupling the second clock terminal 327A, 327B, 327C and 327N of a given clocked full-rail differential logic circuit with sense amplifier and shut-off 300A, 300B, 300C and 300N, respectively, to the first clock input terminal 326B, 326C, 326D (not shown), 326N and 326N+1 (not shown) of the following stage 300B, 300C, 300N and 300N+1 (not shown).

Thus, in FIG. 3, line 320A couples second clock input terminal 327A of clocked full-rail differential logic circuit with sense amplifier and shut-off 300A to first clock input terminal 326B of clocked full-rail differential logic circuit with sense amplifier and shut-off 300B and delay circuit 363 introduces a delay time between signal CLKA 361, coupled to first clock input terminal 326A of clocked full-rail differential logic circuit with sense amplifier and shut-off 300A, and signal CLKB 371, coupled to second clock input terminal 327A of clocked full-rail differential logic circuit with sense amplifier and shut-off 300A. Likewise, line 320B couples second clock input terminal 327B of clocked full-rail differential logic circuit with sense amplifier and shut-off 300B to first clock input terminal 326C of clocked full-rail differential logic circuit with sense amplifier and shut-off 300C and delay circuit 373 introduces a delay time between signal CLKB 371, coupled to first clock input terminal 326B of clocked full-rail differential logic circuit with sense amplifier and shut-off 300B, and signal CLKC 381, coupled to second clock input terminal 327B of clocked full-rail differential logic circuit with sense amplifier and shut-off 300B.

Similarly, line 320C couples second clock input terminal 327C of clocked full-rail differential logic circuit with sense amplifier and shut-off 300C to first clock input terminal 326D (not shown) of a clocked full-rail differential logic circuit with sense amplifier and shut-off 300D (not shown) and delay circuit 383 introduces a delay time between signal CLKC 381, coupled to first clock input terminal 326C of clocked full-rail differential logic circuit with sense amplifier and shut-off 300C, and signal CLKD 382, coupled to second clock input terminal 327C of clocked full-rail differential logic circuit with sense amplifier and shut-off 300C. Likewise, line 320N couples first clock input terminal 326N+1 (not shown) of a clocked full-rail differential logic circuit with sense amplifier and shut-off 300N+1 (not shown) to second clock input terminal 327N of clocked full-rail differential logic circuit with sense amplifier and shut-off 300N and delay circuit 393 introduces a delay time between signal CLKN 391, coupled to first clock input terminal 326N of clocked full-rail differential logic circuit with sense amplifier and shut-off 300N, and signal CLKN+1 392, coupled to second clock input terminal 327N of clocked full-rail differential logic circuit with sense amplifier and shut-off 300N.

In one embodiment of the invention, second clock input terminals 327A, 327B, 327C and 327N of clocked full-rail differential logic circuits with sense amplifier and shut-off 300A, 300B, 300C and 300N, respectively, are coupled to sense amplifiers (not shown in FIG. 3) in clocked full-rail differential logic circuits with sense amplifier and shut-off 300A, 300B, 300C and 300N, such as sense amplifier circuit 280 in FIG. 2, and the signals CLKB, CLKC, CLKD, and CLKN+1 are used as described above with respect to FIG. 2 to trigger the sense amplifiers (not shown in FIG. 3) in clocked full-rail differential logic circuits with sense amplifier and shut-off 300A, 300B, 300C and 300N.

Figure 4:
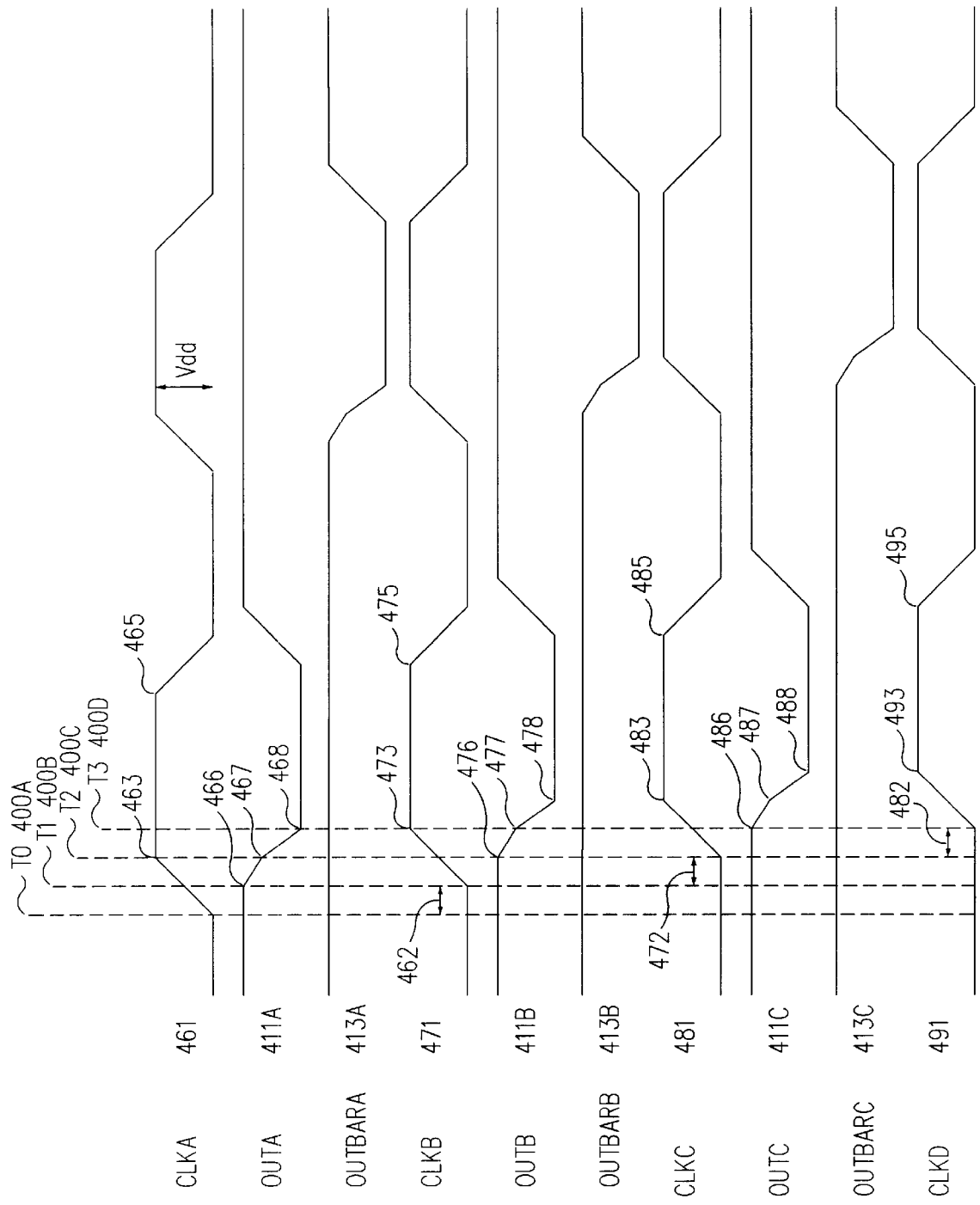
FIG. 4 is a one embodiment of a timing diagram for the cascaded chain of clocked full-rail differential logic circuits with sense amplifier and shut-off of the invention shown in FIG. 3.

FIG. 4 is one embodiment of a timing diagram for cascaded chain 301 of clocked full-rail differential logic circuits with sense amplifier and shut-off 300A, 300B, 300C, and 300N of FIG. 3. As seen in FIG. 3 and FIG. 4 together, according to one embodiment of the invention, at time T0, i.e., point T0 400A in FIG. 4: signal CLKA 461 begins to go high; OUTA 411A at out terminal 311A is high; OUTBARA 413A is high; CLKB 471 is low; OUTB 411B is high; OUTBARB 413B is high; CLKC 481 is low; OUTC is high; OUTBARC is high; and CLKD 491 is low. delay time 462 from point T0 400A and to point T1 400B is introduced by delay circuit 363. As discussed above, delay time 462 helps ensure clocked full-rail differential logic circuit with sense amplifier and shut-off 300B receives signals OUTA and OUTBARA from clocked full-rail differential logic circuit with sense amplifier and shut-off 300A before the switching of signal CLKB 471. As also discussed above, according to the invention, CLKB 471 also acts as the delayed clock signal to second clock input terminal 327A of clocked full-rail differential logic circuit with sense amplifier and shut-off 300A to serve as a trigger for a sense amplifier circuit, such as sense amplifier circuit 280 of FIG. 2, that is used in clocked full-rail differential logic circuit with sense amplifier and shut-off 300A.

At time T1, i.e., point T1 400B in FIG. 4: signal CLKA 461 continues to go high; OUTA 411A starts to slowly go low at point 466; signal OUTBARA at outBar terminal 313A remains high; CLKB 471 starts to go high; OUTB 411B remains high; OUTBARB 413B remains high; CLKC 481 remains low; OUTC remains high; OUTBARC remains high; and CLKD 491 remains low.

A delay time 472 from point T1 400B and to point T2 400C is introduced by delay circuit 373. As discussed above, delay time 472 helps ensure clocked full-rail differential logic circuit with sense amplifier and shut-off 300C receives signals OUTB and OUTBARB from clocked full-rail differential logic circuit with sense amplifier and shut-off 300B before the switching of signal CLKC 481. As also discussed above, according to the invention, CLKC 481 also acts as the delayed clock signal to second clock input terminal 327B of clocked full-rail differential logic circuit with sense amplifier and shut-off 300B to serve as a trigger for a sense amplifier circuit, such as sense amplifier circuit 280 of FIG. 2, that is used in clocked full-rail differential logic circuit with sense amplifier and shut-off 300B.

At time T2, i.e., point T2 400C in FIG. 4: signal CLKA 461 reaches high point 463; the sense amplifier, such as sense amplifier 280 in FIG. 2, which, according to the invention, is part of clocked full-rail differential logic circuit with sense amplifier and shut-off 300A is activated and Output OUTA 411A pulls strongly low starting at point 467, note the difference in the slope of signal OUTA 411A between points 466 and 467, when the sense amplifier is not activated, and points 467 and 468, when the sense amplifier is activated; OUTBARA remains high; CLKB 471 continues to go high; OUTB 411B begins to slowly go low at point 476; OUTBARB 413B remains high; CLKC 481 starts to go high; OUTC remains high; OUTBARC remains high; and CLKD 491 remains low.

A delay time 482 from point T2 400C and to point T3 400D is introduced by delay circuit 383. As discussed above, delay time 482 helps ensure clocked full-rail differential logic circuit with sense amplifier and shut-off 300D (not shown) receives signals OUTC and OUTBARC from clocked full-rail differential logic circuit with sense amplifier and shut-off 300C before the switching of signal CLKD 491. As also discussed above, according to the invention, CLKC 491 also acts as the delayed clock signal to second clock input terminal 327C of clocked full-rail differential logic circuit with sense amplifier and shut-off 300C to serve as a trigger for a sense amplifier circuit, such as sense amplifier circuit 280 of FIG. 2, that is used in clocked full-rail differential logic circuit with sense amplifier and shut-off 300C.

At time T3, i.e., point T3 400D in FIG. 4: signal CLKA remains high; OUTA reaches low point 468; OUTBARA remains high; CLKB 471 reaches high point 473; the sense amplifier, such as sense amplifier 280 in FIG. 2, which, according to the invention, is part of clocked full-rail differential logic circuit with sense amplifier and shut-off 300B is activated and Output OUTB 411B pulls strongly low starting at point 477, note the difference in the slope of signal OUTB 411B between points 476 and 477, when the sense amplifier is not activated, and points 477 and 478, when the sense amplifier is activated; CLKC 481 continues to go high; OUTC begins to slowly go low at point 486; OUTBARC remains high; and CLKD 491 begins to go high. As discussed above, according to the invention, any number of clocked full-rail differential logic circuits with sense amplifier and shut-off 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

As discussed above, the clocked full-rail differential logic circuits with sense amplifier and shut-off of the invention are capable of efficient use under heavy loads and are therefore more flexible, more space efficient and more reliable than prior art full-rail differential logic circuits. In addition, the present invention provides a full-rail differential logic circuit with shut-off that does not experience the large "dip" experienced by prior art full-rail differential logic circuits and is therefore more power efficient. In addition, the present invention provides a full-rail differential logic circuit with shut-off that is more resistant to noise than prior art full-rail differential logic circuits.

As also discussed above, the clocked full-rail differential logic circuits with sense amplifier and shut-off of the invention can be cascaded together to form the chains commonly used in the industry. When the clocked full-rail differential logic circuits with sense amplifier and shut-off of the invention are cascaded together, the advantages of the clocked full-rail differential logic circuits with sense amplifier and shut-off of the invention are particularly evident and the gains in terms of noise immunity, power efficiency, size reduction and flexibility are further pronounced.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A cascaded chain of clocked full-rail differential logic circuits with sense amplifier and shut-off comprising:
    a first clocked full-rail differential logic circuit with sense amplifier and shut-off, said first clocked full-rail differential logic circuit with sense amplifier and shut-off comprising:
        a first clocked full-rail differential logic circuit with sense amplifier and shutoff first clock input terminal;
        a first clocked full-rail differential logic circuit with sense amplifier and shutoff second clock input terminal;
        at least one first clocked full-rail differential logic circuit with sense amplifier and shut-off data input terminal; and
        at least one first clocked full-rail differential logic circuit with sense amplifier and shut-off data output terminal;
    a second clocked full-rail differential logic circuit with sense amplifier and shut-off, said second clocked full-rail differential logic circuit with sense amplifier and shut-off comprising:
        a second clocked full-rail differential logic circuit with sense amplifier and shutoff first clock input terminal;
        a second clocked full-rail differential logic circuit with sense amplifier and shutoff second clock input terminal;
        at least one second clocked full-rail differential logic circuit with sense amplifier and shut-off data input terminal; and
        at least one second clocked full-rail differential logic circuit with sense amplifier and shut-off data output terminal;
    a first clock signal coupled to said first clocked full-rail differential logic circuit with sense amplifier and shut-off first clock input terminal;
    a second clock signal coupled to said second clocked full-rail differential logic circuit with sense amplifier and shut-off first clock input terminal and said first clocked full-rail differential logic circuit with sense amplifier and shut-off second clock input terminal, wherein;
    said at least one first clocked full-rail differential logic circuit with sense amplifier and shut-off data output terminal is coupled to said at least one second clocked full-rail differential logic circuit with sense amplifier and shut-off data input terminal, further wherein;
    said second clock signal is delayed with respect to said first clock signal by a predetermined delay time.

2. The cascaded chain of clocked full-rail differential logic circuits with sense amplifier and shut-off of claim 1, further comprising:
    a delay circuit coupled between said first clocked full-rail differential logic circuit with sense amplifier and shut-off clock input terminal and said second clocked full-rail differential logic circuit with sense amplifier and shut-off clock input terminal for delaying said second clock signal with respect to said first clock signal by said predetermined delay time.

3. The cascaded chain of clocked full-rail differential logic circuits with sense amplifier and shut-off of claim 2, wherein;
    said delay circuit comprises at least one inverter.

4. The cascaded chain of clocked full-rail differential logic circuits with sense amplifier and shut-off of claim 2, wherein;
    said first clocked full-rail differential logic circuit with sense amplifier and shut-off comprises a sense amplifier circuit coupled to said first clocked full-rail differential logic circuit with sense amplifier and shut-off second clock input terminal; and
    said second clocked full-rail differential logic circuit with sense amplifier and shut-off comprises a sense amplifier circuit coupled to said second clocked full-rail differential logic circuit with sense amplifier and shut-off second clock input terminal.

5. A cascaded chain of clocked full-rail differential logic circuits with sense amplifier and shut-off comprising:
   a first supply voltage;
   a second supply voltage;
   a first clocked full-rail differential logic circuit with sense amplifier and shut-off, said first clocked full-rail differential logic circuit with sense amplifier and shut-off comprising:
      a first clocked full-rail differential logic circuit with sense amplifier and shut-off out terminal;
      a first clocked full-rail differential logic circuit with sense amplifier and shut-off outBar terminal;
      a first clocked full-rail differential logic circuit with sense amplifier and shut-off first node, said first clocked full-rail differential logic circuit with sense amplifier and shut-off first node being coupled to said first supply voltage;
      a first transistor, said first transistor comprising a first transistor first flow electrode, a first transistor second flow electrode and a first transistor control electrode, said first clocked full-rail differential logic circuit with sense amplifier and shut-off first node being coupled to said first transistor first flow electrode, said first transistor second flow electrode being coupled to said first clocked full-rail differential logic circuit with sense amplifier and shut-off out terminal;
      a second transistor, said second transistor comprising a second transistor first flow electrode, a second transistor second flow electrode and a second transistor control electrode, said first clocked full-rail differential logic circuit with sense amplifier and shut-off first node being coupled to said second transistor first flow electrode, said second transistor second flow electrode being coupled to said first clocked full-rail differential logic circuit with sense amplifier and shut-off outBar terminal;
      a third transistor, said third transistor comprising a third transistor first flow electrode, a third transistor second flow electrode and a third transistor control electrode, said first transistor control electrode being coupled to said third transistor first flow electrode and said first clocked full-rail differential logic circuit with sense amplifier and shut-off outBar terminal, said second transistor control electrode being coupled to said third transistor second flow electrode and said first clocked full-rail differential logic circuit with sense amplifier and shut-off out terminal;
      a fourth transistor, said fourth transistor comprising a fourth transistor first flow electrode, a fourth transistor second flow electrode and a fourth transistor control electrode; said fourth transistor first flow electrode being coupled to said first clocked full-rail differential logic circuit with sense amplifier and shut-off first node, said fourth transistor second flow electrode being coupled to said first clocked full-rail differential logic circuit with sense amplifier and shut-off out terminal, said fourth transistor control electrode being coupled to a first clock signal;
      a fifth transistor, said fifth transistor comprising a fifth transistor first flow electrode, a fifth transistor second flow electrode and a fifth transistor control electrode; said fifth transistor first flow electrode being coupled to said first clocked full-rail differential logic circuit with sense amplifier and shut-off first node, said fifth transistor second flow electrode being coupled to said first clocked full-rail differential logic circuit with sense amplifier and shut-off outBar terminal, said fifth transistor control electrode being coupled to said first clock signal;
      a first clocked full-rail differential logic circuit with sense amplifier and shut-off sense amplifier circuit coupled between said first clocked full-rail differential logic circuit with sense amplifier and shut-off out terminal and said first clocked full-rail differential logic circuit with sense amplifier and shut-off outbar terminal, said first clocked full-rail differential logic circuit with sense amplifier and shut-off sense amplifier circuit having an input terminal coupled to a second clock signal;
      a first clocked full-rail differential logic circuit with sense amplifier and shut-off shut-off device coupled between said first clocked full-rail differential logic circuit with sense amplifier and shut-off out terminal and said first clocked full-rail differential logic circuit with sense amplifier and shut-off outBar terminal;
      a logic network, said logic network comprising: at least one logic network input terminal; a logic network out terminal; and a logic network outBar terminal, said logic network out terminal being coupled to said first clocked full-rail differential logic circuit with sense amplifier and shut-off shut-off device and said logic network outBar terminal being coupled to said first clocked full-rail differential logic circuit with sense amplifier and shut-off shut-off device;
   a second clocked full-rail differential logic circuit with sense amplifier and shut-off, said second clocked full-rail differential logic circuit with sense amplifier and shut-off comprising:
      a second clocked full-rail differential logic circuit with sense amplifier and shut-off out terminal;
      a second clocked full-rail differential logic circuit with sense amplifier and shut-off outBar terminal;
      a second clocked full-rail differential logic circuit with sense amplifier and shut-off first node, said second clocked full-rail differential logic circuit with sense amplifier and shut-off first node being coupled to said first supply voltage;
      a first transistor, said first transistor comprising a first transistor first flow electrode, a first transistor second flow electrode and a first transistor control electrode, said second clocked full-rail differential logic circuit with sense amplifier and shut-off first node being coupled to said first transistor first flow electrode, said first transistor second flow electrode being coupled to said second clocked full-rail differential logic circuit with sense amplifier and shut-off out terminal;
      a second transistor, said second transistor comprising a second transistor first flow electrode, a second transistor second flow electrode and a second transistor control electrode, said second clocked full-rail differential logic circuit with sense amplifier and shut-off first node being coupled to said second transistor first flow electrode, said second transistor second flow electrode being coupled to said second clocked full-rail differential logic circuit with sense amplifier and shut-off outBar terminal;
      a third transistor, said third transistor comprising a third transistor first flow electrode, a third transistor second flow electrode and a third transistor control electrode, said first transistor control electrode being coupled to said third transistor first flow electrode and said second clocked full-rail differential logic circuit with sense amplifier and shut-off outBar terminal, said second transistor control electrode being coupled to said third transistor second flow electrode and said second clocked full-rail differential logic circuit with sense amplifier and shut-off out terminal;

a fourth transistor, said fourth transistor comprising a fourth transistor first flow electrode, a fourth transistor second flow electrode and a fourth transistor control electrode; said fourth transistor first flow electrode being coupled to said second clocked full-rail differential logic circuit with sense amplifier and shut-off first node, said fourth transistor second flow electrode being coupled to said second clocked full-rail differential logic circuit with sense amplifier and shut-off out terminal, said fourth transistor control electrode being coupled to said second clock signal;

a fifth transistor, said fifth transistor comprising a fifth transistor first flow electrode, a fifth transistor second flow electrode and a fifth transistor control electrode; said fifth transistor first flow electrode being coupled to said second clocked full-rail differential logic circuit with sense amplifier and shut-off first node, said fifth transistor second flow electrode being coupled to said second clocked full-rail differential logic circuit with sense amplifier and shut-off outBar terminal, said fifth transistor control electrode being coupled to said second clock signal;

a second clocked full-rail differential logic circuit with sense amplifier and shut-off sense amplifier circuit coupled between said second clocked full-rail differential logic circuit with sense amplifier and shut-off out terminal and said second clocked full-rail differential logic circuit with sense amplifier and shut-off outBar terminal, said second clocked full-rail differential logic circuit with sense amplifier and shut-off sense amplifier circuit having an input terminal coupled to a third clock signal;

a second clocked full-rail differential logic circuit with sense amplifier and shut-off shut-off device coupled between said second clocked full-rail differential logic circuit with sense amplifier and shut-off out terminal and said second clocked full-rail differential logic circuit with sense amplifier and shut-off outBar terminal;

a logic network, said logic network comprising: at least one logic network input terminal; a logic network out terminal; and a logic network outBar terminal, said logic network out terminal being coupled to said second clocked full-rail differential logic circuit with sense amplifier and shut-off shut-off device and said logic network outBar terminal being coupled to said second clocked full-rail differential logic circuit with sense amplifier and shut-off shut-off device, wherein;

said second clock signal is delayed with respect to said first clock signal by a predetermined delay time and said third clock signal is delayed with respect to said second clock signal by a predetermined delay time.

6. The cascaded chain of clocked full-rail differential logic circuits with sense amplifier and shut-off of claim 5, wherein;

said a first clocked full-rail differential logic circuit with sense amplifier and shut-off sense amplifier circuit comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to a first clocked full-rail differential logic circuit with sense amplifier and shut-off second node, said sixth transistor control electrode being coupled to said third transistor first flow electrode and said first clocked full-rail differential logic circuit with sense amplifier and shut-off outBar terminal;

a seventh transistor, said seventh transistor comprising a seventh transistor first flow electrode, a seventh transistor second flow electrode and a seventh transistor control electrode, said second transistor second flow electrode being coupled to said seventh transistor first flow electrode, said seventh transistor second flow electrode being coupled to said first clocked full-rail differential logic circuit with sense amplifier and shut-off second node, said seventh transistor control electrode being coupled to said third transistor second flow electrode and said first clocked full-rail differential logic circuit with sense amplifier and shut-off out terminal;

an eighth transistor, said eighth transistor comprising an eighth transistor first flow electrode, an eighth transistor second flow electrode and an eighth transistor control electrode, said eighth transistor first flow electrode being coupled to said first clocked full-rail differential logic circuit with sense amplifier and shut-off second node, said eighth transistor second flow electrode being coupled to said second supply voltage, said eighth transistor control electrode being coupled to receive said second clock signal, further wherein; said a second clocked full-rail differential logic circuit with sense amplifier and shut-off sense amplifier circuit comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to a second clocked full-rail differential logic circuit with sense amplifier and shut-off second node, said sixth transistor control electrode being coupled to said third transistor first flow electrode and said second clocked full-rail differential logic circuit with sense amplifier and shut-off outBar terminal;

a seventh transistor, said seventh transistor comprising a seventh transistor first flow electrode, a seventh transistor second flow electrode and a seventh transistor control electrode, said second transistor second flow electrode being coupled to said seventh transistor first flow electrode, said seventh transistor second flow electrode being coupled to said second clocked full-rail differential logic circuit with sense amplifier and shut-off second node, said seventh transistor control electrode being coupled to said third transistor second flow electrode and said second clocked full-rail differential logic circuit with sense amplifier and shut-off out terminal;

an eighth transistor, said eighth transistor comprising an eighth transistor first flow electrode, an eighth transistor second flow electrode and an eighth transistor control electrode, said eighth transistor first flow electrode being coupled to said second clocked full-rail differential logic circuit with sense amplifier and shut-off second node, said eighth transistor second flow electrode being coupled to said second supply voltage, said eighth transistor control electrode being coupled to receive said third clock signal.

7. The cascaded chain of clocked full-rail differential logic circuits with sense amplifier and shut-off of claim 5, wherein;

said a first clocked full-rail differential logic circuit with sense amplifier and shut-off shut-off device comprises:
a ninth transistor, said ninth transistor comprising a ninth transistor first flow electrode, a ninth transistor second flow electrode and a ninth transistor control electrode, said fourth transistor second flow electrode being coupled to said ninth transistor first flow electrode, said ninth transistor second flow electrode being coupled to said out terminal of said logic network, said ninth transistor control electrode being coupled to said third transistor first flow electrode and said first clocked full-rail differential logic circuit with sense amplifier and shut-off outBar terminal;
a tenth transistor, said tenth transistor comprising a tenth transistor first flow electrode, a tenth transistor second flow electrode and a tenth transistor control electrode, said fifth transistor second flow electrode being coupled to said tenth transistor first flow electrode, said tenth transistor second flow electrode being coupled to said outBar terminal of said logic network, said tenth transistor control electrode being coupled to said third transistor second flow electrode and said first clocked full-rail differential logic circuit with sense amplifier and shut-off out terminal, further wherein;

said a second clocked full-rail differential logic circuit with sense amplifier and shut-off shut-off device comprises:
a ninth transistor, said ninth transistor comprising a ninth transistor first flow electrode, a ninth transistor second flow electrode and a ninth transistor control electrode, said fourth transistor second flow electrode being coupled to said ninth transistor first flow electrode, said ninth transistor second flow electrode being coupled to said out terminal of said logic network, said ninth transistor control electrode being coupled to said third transistor first flow electrode and said second clocked full-rail differential logic circuit with sense amplifier and shut-off outBar terminal;
a tenth transistor, said tenth transistor comprising a tenth transistor first flow electrode, a tenth transistor second flow electrode and a tenth transistor control electrode, said fifth transistor second flow electrode being coupled to said tenth transistor first flow electrode, said tenth transistor second flow electrode being coupled to said outBar terminal of said logic network, said tenth transistor control electrode being coupled to said third transistor second flow electrode and said second clocked full-rail differential logic circuit with sense amplifier and shut-off out terminal.

8. The cascaded chain of clocked full-rail differential logic circuits with sense amplifier and shut-off of claim 5, wherein;

said logic network of said first clocked full-rail differential logic circuit with sense amplifier and shut-off and said logic network of said second clocked full-rail differential logic circuit with sense amplifier and shut-off comprise differential logic.

9. The cascaded chain of clocked full-rail differential logic circuits with sense amplifier and shut-off of claim 5, wherein;

said logic network of said first clocked full-rail differential logic circuit with sense amplifier and shut-off and said logic network of said second clocked full-rail differential logic circuit with sense amplifier and shut-off comprise differential logic gates.

10. The cascaded chain of clocked full-rail differential logic circuits with sense amplifier and shut-off of claim 5, wherein;

said logic network of said first clocked full-rail differential logic circuit with sense amplifier and shut-off and said logic network of said second clocked full-rail differential logic circuit with sense amplifier and shut-off comprise NMOS pass transistor logic;

said logic network of said first clocked full-rail differential logic circuit with sense amplifier and shut-off comprises at least one control variable input and at least one pass variable input; and said logic network of said second clocked full-rail differential logic circuit with sense amplifier and shut-off comprises at least one control variable input and at least one pass variable input.

11. The cascaded chain of clocked full-rail differential logic circuits with sense amplifier and shut-off of claim 5, wherein;

said first supply voltage is Vdd and said second supply voltage is ground.

12. The cascaded chain of clocked full-rail differential logic circuits with sense amplifier and shut-off of claim 11, wherein;

said first transistor, said second transistor, said third transistor, said fourth transistor and said fifth transistor of said first clocked full-rail differential logic circuit with sense amplifier and shut-off and said first transistor, said second transistor, said third transistor, said fourth transistor and said fifth transistor of said second clocked full-rail differential logic circuit with sense amplifier and shut-off are PFETs.

13. The cascaded chain of clocked full-rail differential logic circuits with sense amplifier and shut-off of claim 12, wherein;

said sixth transistor, said seventh transistor, said eighth transistor, said ninth transistor, and said tenth transistor of said first clocked full-rail differential logic circuit with sense amplifier and shut-off and said third transistor, said sixth transistor, said seventh transistor, said eighth transistor, said ninth transistor, and said tenth transistor of said second clocked full-rail differential logic circuit with sense amplifier and shut-off are NFETs.

14. A clocked full-rail differential logic circuit with sense amplifier and shut-off comprising:
a first supply voltage;
a second supply voltage;
a clocked full-rail differential logic circuit with sense amplifier and shut-off out terminal;
a clocked full-rail differential logic circuit with sense amplifier and shut-off outBar terminal;

a clocked full-rail differential logic circuit with sense amplifier and shut-off first node, said clocked full-rail differential logic circuit with sense amplifier and shut-off first node being coupled to said first supply voltage;

a first transistor, said first transistor comprising a first transistor first flow electrode, a first transistor second flow electrode and a first transistor control electrode, said clocked full-rail differential logic circuit with sense amplifier and shut-off first node being coupled to said first transistor first flow electrode, said first transistor second flow electrode being coupled to said clocked full-rail differential logic circuit with sense amplifier and shut-off out terminal;

a second transistor, said second transistor comprising a second transistor first flow electrode, a second transistor second flow electrode and a second transistor control electrode, said clocked full-rail differential logic circuit with sense amplifier and shut-off first node being coupled to said second transistor first flow electrode, said second transistor second flow electrode being coupled to said clocked full-rail differential logic circuit with sense amplifier and shut-off outBar terminal;

a third transistor, said third transistor comprising a third transistor first flow electrode, a third transistor second flow electrode and a third transistor control electrode, said first transistor control electrode being coupled to said third transistor first flow electrode and said clocked full-rail differential logic circuit with sense amplifier and shut-off outBar terminal, said second transistor control electrode being coupled to said third transistor second flow electrode and said clocked full-rail differential logic circuit with sense amplifier and shut-off out terminal;

a fourth transistor, said fourth transistor comprising a fourth transistor first flow electrode, a fourth transistor second flow electrode and a fourth transistor control electrode; said fourth transistor first flow electrode being coupled to said clocked full-rail differential logic circuit with sense amplifier and shut-off first node, said fourth transistor second flow electrode being coupled to said clocked full-rail differential logic circuit with sense amplifier and shut-off out terminal, said fourth transistor control electrode being coupled a first clock signal;

a fifth transistor, said fifth transistor comprising a fifth transistor first flow electrode, a fifth transistor second flow electrode and a fifth transistor control electrode; said fifth transistor first flow electrode being coupled to said clocked full-rail differential logic circuit with sense amplifier and shut-off first node, said fifth transistor second flow electrode being coupled to said clocked full-rail differential logic circuit with sense amplifier and shut-off outBar terminal, said fifth transistor control electrode being coupled said first clock signal;

a clocked full-rail differential logic circuit with sense amplifier and shut-off sense amplifier circuit coupled between said clocked full-rail differential logic circuit with sense amplifier and shut-off out terminal and said clocked full-rail differential logic circuit with sense amplifier and shut-off outBar terminal, said clocked full-rail differential logic circuit with sense amplifier and shut-off sense amplifier circuit having an input terminal coupled to a second clock signal;

a clocked full-rail differential logic circuit with sense amplifier and shut-off shut-off device coupled between said clocked full-rail differential logic circuit with sense amplifier and shut-off out terminal and said clocked full-rail differential logic circuit with sense amplifier and shut-off outBar terminal;

a logic network, said logic network comprising: at least one logic network input terminal; a logic network out terminal; and a logic network outBar terminal, said logic network out terminal being coupled to said clocked full-rail differential logic circuit with sense amplifier and shut-off shut-off device and said logic network outBar terminal being coupled to said clocked full-rail differential logic circuit with sense amplifier and shut-off shut-off device, wherein;

said second clock signal is delayed with respect to said first clock signal by a predetermined time.

15. The clocked full-rail differential logic circuit with sense amplifier and shut-off of claim 14, wherein;

said clocked full-rail differential logic circuit with sense amplifier and shut-off sense amplifier circuit comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to a clocked full-rail differential logic circuit with sense amplifier and shut-off second node, said sixth transistor control electrode being coupled to said third transistor first flow electrode and said clocked full-rail differential logic circuit with sense amplifier and shut-off outBar terminal;

a seventh transistor, said seventh transistor comprising a seventh transistor first flow electrode, a seventh transistor second flow electrode and a seventh transistor control electrode, said second transistor second flow electrode being coupled to said seventh transistor first flow electrode, said seventh transistor second flow electrode being coupled to said clocked full-rail differential logic circuit with sense amplifier and shut-off second node, said seventh transistor control electrode being coupled to said third transistor second flow electrode and said clocked full-rail differential logic circuit with sense amplifier and shut-off out terminal;

an eighth transistor, said eighth transistor comprising an eighth transistor first flow electrode, an eighth transistor second flow electrode and an eighth transistor control electrode, said eighth transistor first flow electrode being coupled to said clocked full-rail differential logic circuit with sense amplifier and shut-off second node, said eighth transistor second flow electrode being coupled to said second supply voltage, said eighth transistor control electrode being coupled to receive said second clock signal.

16. The clocked full-rail differential logic circuit with sense amplifier and shut-off of claim 15, wherein;

said a clocked full-rail differential logic circuit with sense amplifier and shut-off shut-off device comprises:

a ninth transistor, said ninth transistor comprising a ninth transistor first flow electrode, a ninth transistor second flow electrode and a ninth transistor control electrode, said fourth transistor second flow electrode being coupled to said ninth transistor first flow electrode, said ninth transistor second flow electrode being coupled to said out terminal of said logic network, said ninth transistor control electrode being coupled to said third transistor first flow electrode and said clocked full-rail differential logic circuit with sense amplifier and shut-off outBar terminal;

a tenth transistor, said tenth transistor comprising a tenth transistor first flow electrode, a tenth transistor second flow electrode and a tenth transistor control electrode, said fifth transistor second flow electrode being coupled to said tenth transistor first flow electrode, said tenth transistor second flow electrode being coupled to said outBar terminal of said logic network, said tenth transistor control electrode being coupled to said third transistor second flow electrode and said clocked full-rail differential logic circuit with sense amplifier and shut-off out terminal.

17. The clocked full-rail differential logic circuit with sense amplifier and shut-off of claim 14, wherein;

said logic network of said clocked full-rail differential logic circuit with sense amplifier and shut-off comprises differential logic.

18. The clocked full-rail differential logic circuit with sense amplifier and shut-off of claim 14, wherein;

said logic network of said clocked full-rail differential logic circuit with sense amplifier and shut-off comprises differential logic gates.

19. The clocked full-rail differential logic circuit with sense amplifier and shut-off of claim 14, wherein;

said logic network of said clocked full-rail differential logic circuit with sense amplifier and shut-off comprises NMOS pass transistor logic; and said logic network of said clocked full-rail differential logic circuit with sense amplifier and shut-off includes at least one control variable input and at least one pass variable input.

20. The clocked full-rail differential logic circuit with sense amplifier and shut-off of claim 14, wherein;

said first supply voltage is Vdd and said second supply voltage is ground.

21. The clocked full-rail differential logic circuit with sense amplifier and shut-off of claim 18, wherein;

said first transistor, said second transistor, said third transistor, said fourth transistor and said fifth transistor are PFETs.

22. The clocked full-rail differential logic circuit with sense amplifier and shut-off of claim 19, wherein;

said sixth transistor, said seventh transistor, said eighth transistor, said ninth transistor and said tenth transistor are NFETs.

\* \* \* \* \*